US006931331B2

(12) United States Patent
McTigue

(10) Patent No.: US 6,931,331 B2
(45) Date of Patent: Aug. 16, 2005

(54) MEASUREMENT INTERFACE OPTIMIZED FOR BOTH DIFFERENTIAL AND SINGLE-ENDED INPUTS

(75) Inventor: Michael Thomas McTigue, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 83 days.

(21) Appl. No.: 10/697,234

(22) Filed: Oct. 30, 2003

(65) Prior Publication Data
US 2005/0114047 A1 May 26, 2005

(51) Int. Cl.[7] ............................ G01R 15/00; G06F 19/00
(52) U.S. Cl. ........................ 702/57; 702/107; 341/118; 327/361
(58) Field of Search ................. 702/104, 107, 702/116, 117, 118, 168, 91; 327/560, 561, 327/355, 359, 361; 324/608, 724; 708/843; 341/118; 330/279; 356/338; 365/189.09

(56) References Cited

U.S. PATENT DOCUMENTS

| | | | | |
|---|---|---|---|---|
| 3,710,139 A | * | 1/1973 | Werner | 330/99 |
| 3,737,640 A | * | 6/1973 | Pao et al. | 708/843 |
| 3,868,679 A | * | 2/1975 | Arneson | 341/118 |
| 3,967,901 A | * | 7/1976 | Rodriguez | 356/338 |
| 3,978,402 A | * | 8/1976 | Ryder | 324/607 |
| 4,182,993 A | * | 1/1980 | Tyler | 330/279 |
| 5,384,739 A | * | 1/1995 | Keeth | 365/189.09 |

* cited by examiner

Primary Examiner—Bryan Bui
Assistant Examiner—Aditya Bhat

(57) ABSTRACT

Offset adjustments for both differential and single-ended measurements are accomplished in the same probe or system. Different variable offsets are provided for the positive and negative inputs of a differential amplifier, and a variable offset adjustment is provided to remove differential amplifier output offset. Common mode and reduced dynamic range problems for both differential and single-ended measurements are eliminated. All or desired portions of required functions may be implemented using discrete or DSP approaches.

15 Claims, 2 Drawing Sheets

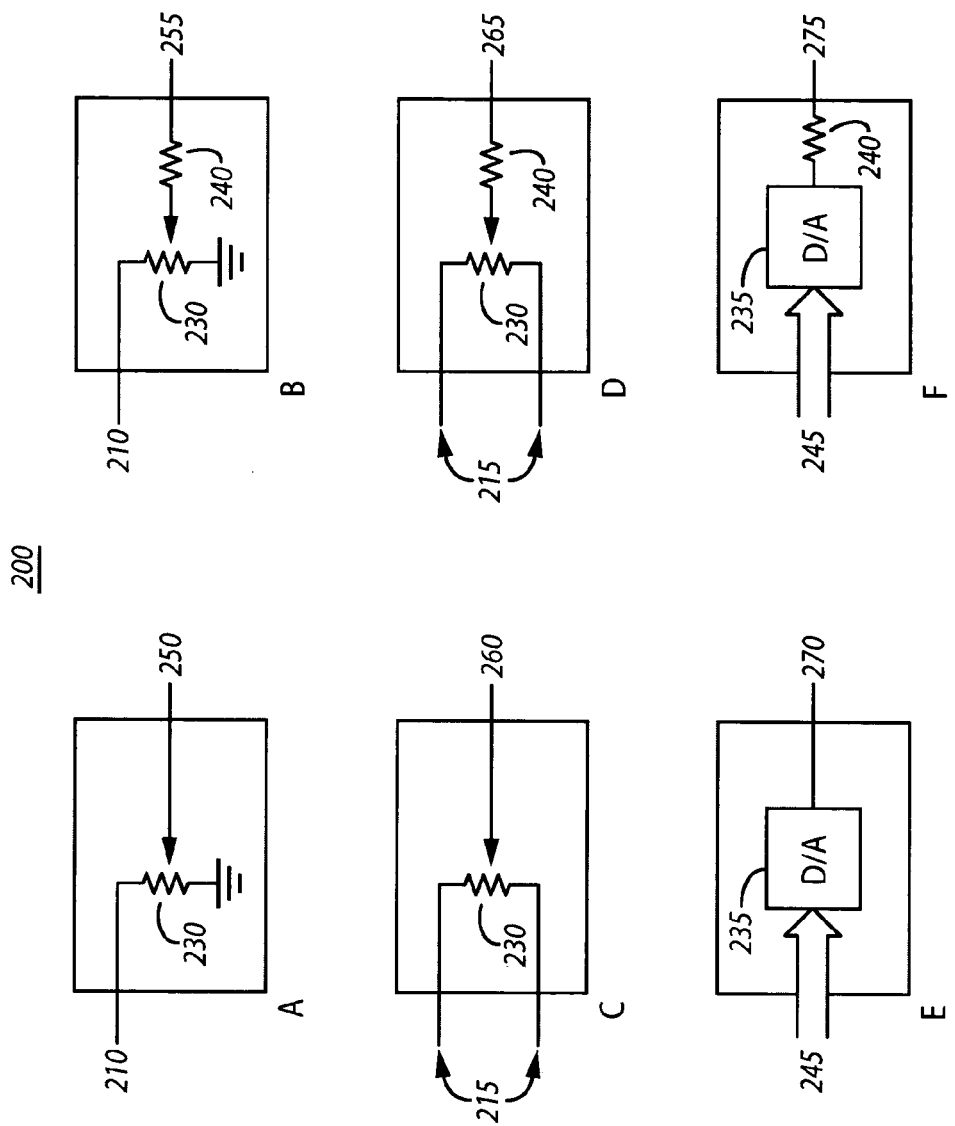

MEASUREMENT INTERFACE OPTIMIZED FOR BOTH DIFFERENTIAL AND SINGLE-ENDED INPUTS

FIELD OF THE INVENTION

This invention relates generally to the field of electronic measurement interfaces and probes. More particularly, this invention relates to differential input probes that are also optimized for single-ended inputs. More specifically, the present invention describes probe circuitry with variable differential offsets for optimizing differential measurements, and variable single-ended offsets for optimizing single-ended measurements.

BACKGROUND

The need to interface between the point of measurement and the measurement device has always been basic to electrical measurements. It is well known that any measurement interface is theoretically imperfect, as there is always distortion of the measurement point data by the measurement interface that results in the measurement device being presented with data to be measured that is not totally accurate.

In many cases this discrepancy does not matter, as the data presented may be accurate enough for the measurement accuracy desired. In other cases, however, the data at the measurement device input may be significantly in error, as is fairly common when making very precise voltage or high frequency measurements.

One common limitation of measurement interfaces such as probes is sensitivity to measurement point offset voltages. In both single-ended and differential probes an offset could cause the input dynamic range to be exceeded or limited which would adversely affect measurement accuracy or resolution. This applies to both active and passive probes, as the passive probe may pass large offsets on to the measurement device and produce similar dynamic range problems in that device.

BRIEF SUMMARY

This invention relates generally to the field of electronic measurement probes, and more particularly to differential probes which are also optimized for accuracy in making single-ended measurements. The present invention describes a differential probe amplifier with differential offset for optimizing differential measurements, and single-ended offset for optimizing single-ended measurements. Objects, advantages and features of the invention will become apparent to those skilled in the art upon consideration of the following detailed description of the invention.

In accordance with certain embodiments, an apparatus is described which is capable of making both differential and single-ended measurements, comprising first and second summation element capable of accepting first and second inputs, a first and second final offset inputs applied to the aforementioned summation elements wherein the output of each is the algebraic sum of its inputs. First and second switches disable or enable their respective offset inputs. A differential amplifier accepts first and second summation element outputs as differential inputs, and the output of the differential amplifier is routed to a summation element input. A third switch allows insertion of a third offset voltage to the other input of the switch, wherein the differential amplifier offset may be nulled out or a desired measurement DC level may be set.

In accordance with certain embodiments, a system interface using elements of this apparatus is described for optimizing differential and single-ended measurements. In addition to the preceding description, control of apparatus elements allows extended control by sources internal to the apparatus or external to the apparatus.

In accordance with certain embodiments of the invention, a method of optimizing single-ended and differential inputs received by the measurement interface, comprising selectively modifying offset from the first input; selectively modifying offset from the second input; generating the algebraic difference of the first and second inputs after offset has been selectively modified from each; and selectively modifying the final output offset to nullify differential amplifier offset or to establish a desired DC output component.

In accordance with certain embodiments of the invention, an apparatus is described which is operable to receive and operate on first and second inputs, comprising first means for removing offset from a first input, a second means for removing offset from a second input, a means for taking the algebraic difference of the output of first and second means, and a means for removing output offset or establishing a desired measurement DC level.

In accordance with certain embodiments, a measurement interface capable of optimizing single-ended and differential inputs received by the measurement interface comprises a first summing element operable to selectively modify offset from a first input and generate a first summation element output; a second summing element operable to selectively modify offset from a second input and generate a second summation element output; and a difference element that receives the first and second summation element outputs and generates the difference between said first and second summation element outputs at an output of the difference element.

Many variations, equivalents and permutations of these illustrative exemplary embodiments of the invention will occur to those skilled in the art upon consideration of the description that follows. The particular examples above should not be considered to define or limit the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

FIG. 2 is an exemplary schematic of offset adjustment techniques utilized in accordance with certain embodiments of the present invention.

DETAILED DESCRIPTION

Figure 1:
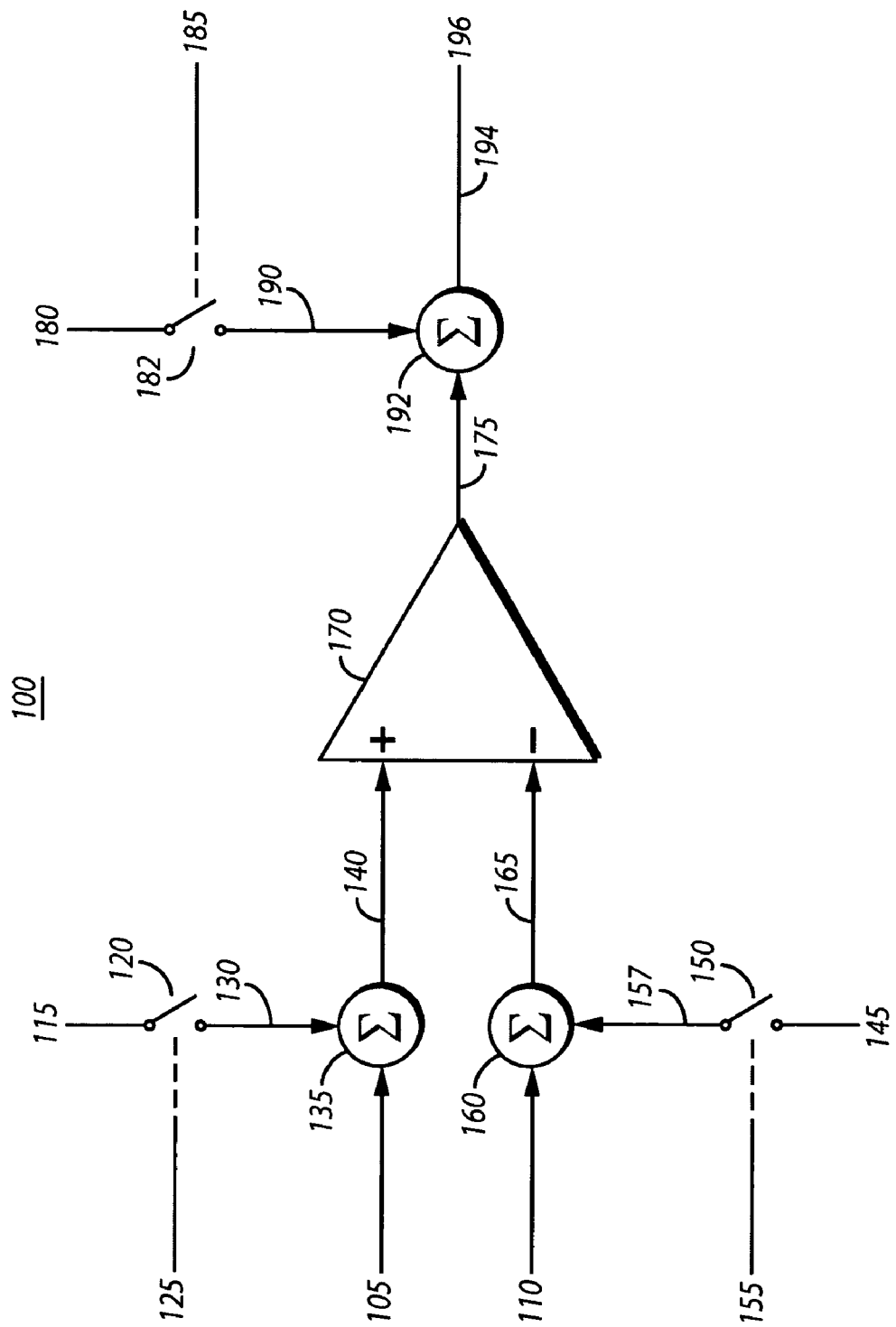
FIG. 1 is an exemplary schematic of an optimized measurement interface for differential and single-ended inputs in accordance with certain embodiments of the present invention.

The present invention relates generally to measurement interfaces, and particularly to probes for electronic measurements. Objects, advantages and features of the invention will become apparent to those skilled in the art upon consideration of the following detailed description of the invention.

An apparatus for providing input offset adjustments independently for both differential inputs in accordance with certain embodiments of the present invention is described. This is a feature of the present invention that allows differential measurements to be made in situations where both inputs are not at the same DC potential, or both inputs are at significant DC levels, thereby increasing measurement dynamic range and minimizing common mode problems.

This apparatus also allows offset adjustment for single-ended inputs in accordance with certain other embodiments of the present invention. This is a feature of the present invention, allowing a portion of the circuitry of a differential probe to function in an optimal manner for removing DC offsets in single-ended inputs thereby increasing measurement dynamic range and minimizing common mode problems.

The apparatus will also provide an output offset adjustment for a measurement interface or probe which may be used in conjunction with both differential inputs and single-ended inputs, in accordance with certain other embodiments of the present invention. This feature of the present invention allows for nullification of any offset generated in the probe itself and provides the ability to set static DC levels for improved measurements downstream of the probe.

The apparatus described provides an output adjustment for a differential probe when used as a single-ended probe, which may be used in conjunction with the single-ended offset adjustments, is described in accordance with certain embodiments of the present invention. This is a feature of the present invention that allows for nullification of any offset generated in the probe itself.

The present invention describes a probe that may contain all the above techniques simultaneously, or may contain only selected techniques. This approach allows one measurement interface or probe design to make optimized measurements of both differential and single-ended inputs.

Many variations, equivalents and permutations of these illustrative exemplary embodiments of the invention will occur to those skilled in the art upon consideration of the description that follows. The particular examples above should not be considered to define the scope of the invention. For example, the setting of the input offset adjustments and/or the setting of the output adjustments may be under control of a processor internal to or external to the probe. Another example of a variation which does not depart from the spirit of the invention would be implementing any adjustment described in the present invention in a continuous or stepped manner, to include the use of A/D and D/A converters. A further example would be the inclusion of signal conditioning such as filtering, or protection circuitry such as overvoltage, as part of the offset adjustment circuitry.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

For purposes of this document, the exact dimensions and other specific parameters of components are unimportant to an understanding of the invention, and many different types of components may be utilized without departing from the spirit of the invention. An example is that amplifiers and offset adjustment devices may be of various electrical, mechanical, and materials properties as determined most applicable for the application at hand. This document uses continuous resistors by way of example only, but any other device which provides the required variability, such as A/D and D/A converter arrangements or stepped resistive networks, may be utilized. Similarly, amplifiers may be composed of discrete circuitry, integrated circuitry, or custom devices, such as DSP, as appropriate. Many other variations for constituent items may be found without departing from the spirit and scope of the present invention.

Refer to FIG. 1, which is schematic 100 of the apparatus for optimizing both differential and single-ended inputs in accordance with certain embodiments of the present invention. Schematic 100 comprises input 105, input 110, first switch 120, second switch 150, third switch 182, first offset 115, second offset 145, third offset 180, first switch control input 125, second switch control input 155, third switch control input 185, first final offset 130, second final offset 157, third final offset 190, first summation element 135, second summation element 160, third summation element 192, first summation element output 140, second summation element output 165, third summation element output 194, differential amplifier 170, differential amplifier output 175, and final output 196.

Input 105 is applied to a first input of first summation element 135. The second input of first summation element 135 is first final offset 130. Input 105 may be either a voltage or current input, as required by system design. First summation element 135 provides the algebraic sum of Input 105 and first final offset 130 as first summation element output 140. First summation element output 140 may be either a voltage or current as required by system design.

First final offset 130 is derived from the output of first switch 120. The input of first switch 120 is first offset voltage 115. First switch 120 comprises an enable or disable function with respect to connectivity of first offset voltage 115 to first final offset 130, which is the second input of first summation element 135. First switch 120 has first switch control input 125, which will allow either manual switch control or digital switch control as required by system design.

Input 110 is applied to a first input of second summation element 160. The second input of second summation element 160 is second final offset 157. Input 110 may be either a voltage or current input, as required by system design. Second summation element 160 provides the algebraic sum of Input 110 and second final offset 157 as second summation element output 165. First summation element output 165 may be either a voltage or current as required by system design.

Second final offset 157 is derived from the output of second switch 150. The input of second switch 150 is second offset voltage 145. Second switch 150 comprises an enable or disable function with respect to connectivity of second offset voltage 145 to second final offset 157, which is the second input of second summation element 160. Second switch 150 has second switch control input 155, which will allow either manual switch control or digital switch control as required by system design.

Differential amplifier output 175 is applied to a first input of third summation element 192. The second input of third summation element 192 is third final offset 190. Differential amplifier output 175 may be either a voltage or current input, as required by system design. Third summation element 192 provides the algebraic sum of differential amplifier output 175 and third final offset 190 as third summation element output 194. Third summation element output 194 may be either a voltage or current as required by system design.

Third final offset 190 is derived from the output of third switch 182. The input of third switch 182 is third offset voltage 180. Third switch 182 comprises an enable or disable function with respect to connectivity of third offset voltage 180 to third final offset 190, which is the second input of third summation element 192. Third switch 182 has third switch control input 185, which will allow either manual switch control or digital switch control as required by system design.

The three offsets 115, 145, and 180 are derived from sources as required by system design. Examples of such sources will be discussed later. The three offsets 115, 145, and 180 may be the same value or differing values, and they may be controlled manually or digitally, as required by system design. The offsets 115, 145, and 180 may be of any magnitude and polarity as required by system design.

The three switches 120, 150, and 182 allow the final offsets to be switched between offsets 115, 145, and 180 and a zero value to achieve the final offset, respectively. These three switches are operable independently via control inputs 125, 155, and 185. If a specific final offset is to remain zero or a static value, the associated switch and control input are not required. Switch control inputs may be manual or digital, and switch control inputs may be of the same or differing types. Manual switch control inputs may be implemented using potentiometers, for example, and digital switch controls may be controllable locally or remotely as required by system specifications.

Offsets 115, 145, and 180, and switches 120, 150, and 182, and summation elements 135, 160, and 192, may be implemented with discrete electronics, such as transistors and resistors, integrated circuits, or digital signal processing, at the discretion of the designer. Additional devices such as A/D and D/A converters may be required if digital signal processing is implemented.

First summation element output 140 is routed to the positive input of differential amplifier 170, and second summation element output 165 is routed to the negative input of differential amplifier 170. Differential amplifier output 175 is routed to a first input of third summation element 192.

Differential amplifier 170 takes the algebraic difference between first summation element output 140 and second summation element output 165, and provides this difference value as differential amplifier output 175. Differential amplifier 170 may provide gain or loss based on system requirements. Differential amplifier 170 may be implemented with discrete electronics, such as transistors and resistors, integrated circuits, of digital signal processing, at the discretion of the designer. Additional devices such as A/D and D/A converters may be required if digital signal processing is implemented. Additionally the differential inputs and the differential amplifier output may be configured for current or voltage operation, as appropriate.

The following are examples utilizing the apparatus of the present invention. Note that only one apparatus is required to interface the various measurement inputs in an optimum manner.

If the signal to be measured is single-ended with a ground side of zero and a hot side with a static non-zero DC offset, second switch 150 is disabled so as to provide a second final offset 157 of zero. Input 110, which is zero, is applied as the first input of second summation element 160. Second summation output 165 is zero, because both inputs are zero. The negative input of differential amplifier 170 is therefore zero. Input 105 in the most general case is the signal to be measured offset by a static DC level. It is this DC level which will limit dynamic range of differential amplifier 170 if it is applied to the positive input, since it may cause output saturation causing loss of the signal to be measured at the output of the differential amplifier. To prevent this, first switch 120 is enabled and first offset 115 is applied as final offset 130 to the second input of first summation element 135. First summation element output 140 therefore consists of the sum of input 105 and first final offset 130. The value of first final offset may be varied via a variation of first offset 115 so as to nullify any static offset from input 105 appearing at the positive input of differential amplifier 170. This will provide maximum differential amplifier dynamic range. Differential amplifier output 175 may have a static offset added back to it, utilizing third summation element 192, third final offset 190, third switch 182, and third offset 180 in a similar manner. This can be utilized to correct offset due to differential amplifier 170, or can be used to provide a convenient static DC level to expedite following measurements. If a static DC offset modification is not required, third switch 182 may be disabled or third summation element 192, third switch 182, and third offset 180 may be deleted, in which case final output 196 is taken from differential amplifier output 175 instead of third summation element output 194. If it is desired to measure the value of the DC offset present on input 105, first switch 120 may be disabled.

If the signal to be measured is single-ended with a ground side of zero and a hot side with no static DC offset, second switch 150 is disabled so as to provide a second final offset 157 of zero. Input 110, which is zero, is applied as the first input of second summation element 160. Second summation output 165 is zero because both inputs are zero. The negative input of differential amplifier 170 is therefore zero. Input 105 is applied as the first input of first summation element 135. First switch 120 is disabled; forcing final offset 130 to zero. First summation element output 140 therefore consists of the sum of input 105 and first final offset 130, and is zero static DC offset. This will provide maximum differential amplifier dynamic range and minimum common mode problems. Differential amplifier output 175 may have a static offset added back to it, utilizing third summation element 192, third final offset 190, third switch 182, and third offset 180 in a similar manner. This adjustment can be utilized to correct offset due to differential amplifier 170, or it can be used to provide a convenient static DC level to expedite following measurements. If a static DC offset modification is not required, third switch 182 may be disabled or third summation element 192, third switch 182, and third offset 180 may be deleted, in which case final output 196 is taken from differential amplifier output 175 instead of third summation element output 194.

If the signal to be measured is single-ended with a ground side at a static non-zero DC level, and a hot side with a static non-zero DC offset, second switch 150 is enabled so as to provide a non-zero second final offset 157. Second offset 145 may be varied as required to make second offset 157 equal to the negative of the static DC component of input 110. Input 110 is applied as the first input of second summation element 160. Second summation output 165 is zero, because the static offset of input 110 is nullified by the DC component of second final offset 157. The negative input of differential amplifier 170 is therefore zero. Input 105 in the most general case is the signal to be measured offset by a static DC level. It is this DC level in conjunction with any DC level present at the negative input of differential amplifier 170 which will limit dynamic range and produce common mode rejection difficulties with the differential amplifier. To prevent this, first switch 120 is enabled and first offset 115 is applied as final offset 130 to the second input of first summation element 135. First summation element output 140 therefore consists of the sum of input 105 and first final offset 130. The value of first final offset may be varied by adjusting the value of first offset 115 so as to nullify any static DC offset from input 105 appearing at the positive input of differential amplifier 170. Since neither input of differential amplifier 170 contains a DC component, the amplifier dynamic range is maximized and common mode problems are minimized. Differential amplifier output 175 may have a static offset added back to it, utilizing third summation element 192, third final offset 190, third switch 182, and third offset 180 in a similar manner. This can be utilized to correct offset due to differential amplifier 170, or can be used to provide a convenient static DC level to expedite following measurements. If a static DC offset modification is not required, third switch 182 may be disabled or third summation element 192, third switch 182, and third offset 180 may be deleted, in which case final output 196 is taken from differential amplifier output 175 instead of third summation element output 194. If it is desired to measure the value of the DC offset present between the inputs, first offset 115 and second offset 145 are both set to the same value, and that value is the lesser of the offset values as determined above.

If the signal to be measured is single-ended with a ground side at a static DC level that is non-zero, and a hot side with a static DC offset of zero, second switch 150 is enabled so as to provide a non-zero second final offset 157. Second offset 145 may be varied as required to make second offset 157 equal to the negative of the static DC component of input 110. Input 110 is applied as the first input of second summation element 160. Second summation output 165 is zero, because the static offset of input 110 is nullified by the DC component of second final offset 157. The negative input of differential amplifier 170 is therefore zero. Input 105 in the most general case is the signal to be measured offset by a static DC level, which in this example is zero. Any DC level present at the negative input of differential amplifier 170 will limit dynamic range and produce common mode rejection difficulties with the differential amplifier. Since input 105 contains zero static DC offset, first switch 120 is disabled and first final offset 130 has zero static DC offset. First summation element output 140 therefore consists of the sum of input 105 and first final offset 130, and is zero. Since neither input of differential amplifier 170 contains a DC component, the amplifier dynamic range is maximized and common mode problems are minimized. Differential amplifier output 175 may have a static offset added back to it, utilizing third summation element 192, third final offset 190, third switch 182, and third offset 180 in a similar manner. This can be utilized to correct offset due to differential amplifier 170, or can be used to provide a convenient static DC level to expedite following measurements. If a static DC offset modification is not required, third switch 182 may be disabled or third summation element 192, third switch 182, and third offset 180 may be deleted, in which case final output 196 is taken from differential amplifier output 175 instead of third summation element output 194. If it is desired to measure the value of the DC offset present on input 110, second switch 150 may be disabled.

If the signal to be measured is differential with a low side of zero static DC offset and a high side with a static DC offset, second switch 150 is disabled so as to provide a second final offset 157 of zero. Input 110, which has zero static DC offset, is applied as the first input of second summation element 160. Second summation output 165 is zero, because both inputs are zero. The negative input of differential amplifier 170 is therefore zero. It is the DC level present on the positive input of differential amplifier 170 which will limit dynamic since it may cause output saturation causing loss of the signal to be measured at the output of the differential amplifier. To prevent this, first switch 120 is enabled and first offset 115 is applied as final offset 130 to the second input of first summation element 135. First summation element output 140 therefore consists of the sum of input 105 and first final offset 130. The value of first final offset may be varied via a variation of first offset 115 so as to nullify any static DC offset from input 105 appearing at the positive input of differential amplifier 170. This will provide maximum differential amplifier dynamic range. Differential amplifier output 175 may have a static offset added back to it, utilizing third summation element 192, third final offset 190, third switch 182, and third offset 180 in a similar manner. This can be utilized to correct offset due to differential amplifier 170, or can be used to provide a convenient static DC level to expedite following measurements. If a static DC offset modification is not required, third switch 182 may be disabled or third summation element 192, third switch 182, and third offset 180 may be deleted, in which case final output 196 is taken from differential amplifier output 175 instead of third summation element output 194.

If the signal to be measured is differential with a low side of zero static DC offset and a high side with zero static DC offset, second switch 150 is disabled so as to force a second final offset 157 of zero. Input 110, which is zero, is applied as the first input of second summation element 160. Second summation output 165 is zero because both inputs are zero. The negative input of differential amplifier 170 is therefore zero. Input 105 is applied as the first input of first summation element 135. First switch 120 is disabled and final offset 130 is forced to zero DC. First summation element output 140 therefore consists of the sum of input 105 and first final offset 130, and is zero. Since both differential inputs of differential amplifier 170 are zero, maximum dynamic range is provided and common mode problems are minimized. Differential amplifier output 175 may have a static offset added back to it, utilizing third summation element 192, third final offset 190, third switch 182, and third offset 180 in a similar manner. This adjustment can be utilized to correct offset due to differential amplifier 170, or it can be used to provide a convenient static DC level to expedite following measurements. If a static DC offset modification is not required, third switch 182 may be disabled or third summation element 192, third switch 182, and third offset 180 may be deleted, in which case final output 196 is taken from differential amplifier output 175 instead of third summation element output 194.

If the signal to be measured is differential with a low side at a static DC level, and a high side at a static DC offset, second switch 150 is enabled so as to provide a non-zero second final offset 157. Second offset 145 may be varied as required to make second offset 157 equal to the negative of the static DC component of input 110. Input 110 is applied as the first input of second summation element 160. Second summation output 165 is zero, because the static offset of input 110 is nullified by the DC component of second final offset 157. The negative input of differential amplifier 170 is therefore zero. Input 105 is applied to the first input of summation element 135. Any DC level present at the negative or positive input of differential amplifier 170 which will limit dynamic range and produce common mode rejection difficulties. To prevent this at the positive input, first switch 120 is enabled and first offset 115 is applied as final offset 130 to the second input of first summation element 135. First summation element output 140 therefore consists of the sum of input 105 and first final offset 130. The value of first final offset may be varied by adjusting the value of first offset 115 so as to nullify any static DC offset from input 105 appearing at the positive input of differential amplifier 170. Since neither input of differential amplifier 170 contains a DC component, the amplifier dynamic range is maximized and common mode problems are minimized. Differential amplifier output 175 may have a static offset added back to it, utilizing third summation element 192, third final offset 190, third switch 182, and third offset 180 in a similar manner. This can be utilized to correct offset due to differential amplifier 170, or can be used to provide a convenient static DC level to expedite following measurements. If a static DC offset modification is not required, third switch 182 may be disabled or third summation element 192, third switch 182, and third offset 180 may be deleted, in which case final output 196 is taken from differential amplifier output 175 instead of third summation element output 194. If it is desired to measure the value of the DC offset present between the differential inputs, first offset 115 and second offset 145 are both set to the same value, and that value is the lesser of the offset values as determined above.

If the signal to be measured is differential with a low side at a static DC level, and a high side with zero static DC offset, second switch 150 is enabled so as to provide a non-zero second final offset 157. Second offset 145 may be varied as required to make second offset 157 equal to the negative of the static DC component of input 110. Input 110 is applied as the first input of second summation element 160. Second summation output 165 is zero, because the static offset of input 110 is nullified by the DC component of second final offset 157. The negative input of differential amplifier 170 is therefore zero. Input 105 is applied to the first input of summation element 135. Any DC level present at the negative input of differential amplifier 170 will limit dynamic range and produce common mode rejection difficulties with the differential amplifier. Since input 105 contains zero static DC offset, first switch 120 is disabled and first final offset 130 is zero. First summation element output 140 therefore consists of the sum of input 105 and first final offset 130, and is zero. Since neither input of differential amplifier 170 contains a DC component, the amplifier dynamic range is maximized and common mode problems are minimized. Differential amplifier output 175 may have a static offset added back to it, utilizing third summation element 192, third final offset 190, third switch 182, and third offset 180 in a similar manner. This can be utilized to correct offset due to differential amplifier 170, or can be used to provide a convenient static DC level to expedite following measurements. If a static DC offset modification is not required, third switch 182 may be disabled or third summation element 192, third switch 182, and third offset 180 may be deleted, in which case final output 196 is taken from differential amplifier output 175 instead of third summation element output 194. If it is desired to measure the value of the DC offset present on input 110, second switch 150 may be disabled.

Referring to FIGS. 2A–2F, schematics of offset adjustment techniques utilized in accordance with certain embodiments of the present invention are illustrated. FIG. 2A illustrates the use of a single-ended offset 210 routed to variable resistance element 230. The output of variable resistance element 230 is variable offset 250, which may be connected as offset 115, 145, or 180 at the discretion of the designer.

FIG. 2B illustrates the preceding technique with a current output provided by resistive element 240. The output is variable offset 255, which may be connected as offset 115, 145, or 180 at the discretion of the designer.

FIG. 2C illustrates the use of differential offset source 215 which is routed to variable resistive element 230. Differential sources allow for both positive and negative voltages at the output of resistive element 230. The output of variable resistance element 230 is offset 260, which may be connected as offset 115, 145, or 180 at the discretion of the designer.

FIG. 2D illustrates the preceding technique with a current output provided by resistive element 240, which may be connected as offset 115, 145, or 180 at the discretion of the designer.

FIG. 2E illustrates the use of a digitally controlled offset using D/A converter 235. Control of D/A converter 235 may be under local control at the probe, as by a processor integral to the probe, or under control remote to the probe such as a remote processor. D/A converter output 270 may be connected as offset 115, 145, or 180 at the discretion of the designer.

FIG. 2F illustrates the preceding technique with a current output provided by resistive element 240. The output is offset 275, which may be connected as offset 115, 145, or 180 at the discretion of the designer.

It is a feature of the present invention that both optimized differential operation and optimized single-ended operation is achieved within a single probe. This probe offers significant advantages for both single-ended measurements and differential measurements in that optimal dynamic range and common mode protection is achieved. Different combinations of several operational variables is selectable, depending on the nature of the inputs to be measured, as discussed previously.

Those skilled in the art will appreciate that many other circuit and mechanical configurations can be readily devised to accomplish the desired end without departing from the spirit of the present invention. For example, offsets 115, 145, and 180 may be controlled remotely, as can be switches 120, 150, and 182. As another example, any or all elements of the present invention may be implemented using DSP techniques, involving the use of A/D and D/A converters and software as required, using techniques well known in the industry.

While the invention has been described in conjunction with specific embodiments, it is evident that many alternatives, modifications, permutations and variations will become apparent to those of ordinary skill in the art in light of the foregoing description. By way of example, calibration may be automatically accomplished by measuring the DC output present at output 196 and controlling the status of the switches and offset voltages, without departing from the invention. Many other variations are also possible. Accordingly, it is intended that the present invention embrace all such alternatives, modifications and variations as fall within the scope of the appended claims.

What is claimed is:

1. An apparatus capable of making optimal differential and single-ended measurement interfaces, comprising:

a first summation element operable to receive a first input to be measured and a first final offset voltage input, wherein a first summation element output is the algebraic sum of the first input and the first final offset voltage input;

a second summation element operable to receive a second input to be measured and a second final offset voltage input, wherein a second summation element output is the algebraic sum of the second input and the second final offset voltage input;

a first switch operable to receive a first offset voltage and to enable and disable the first final offset voltage;

a second switch operable to receive a second offset voltage and to enable and disable the second final offset;

a differential amplifier operable to receive first and second summation element outputs as differential inputs, having a differential amplifier output which is determined by the difference between the differential inputs;

a third summation element operable to receive the differential amplifier output signal and a third final offset voltage as inputs, and produce a third summation element output which is the algebraic sum of the differential amplifier output signal and the third final offset voltage; and a third switch operable to receive a third offset voltage and to enable and disable the third final offset voltage.

2. The apparatus of claim 1 wherein the first switch is controllable manually, or digitally locally, or digitally external to the apparatus.

3. The apparatus of claim 1 wherein the second switch is controllable manually, or digitally locally, or digitally external to the apparatus.

4. The apparatus of claim 1 wherein the third switch is controllable manually, or digitally locally, or digitally external to the apparatus.

5. The apparatus of claim 1 wherein the first offset voltage is derived using analog or digital techniques.

6. The apparatus of claim 1 wherein the second offset voltage is derived using analog or digital techniques.

7. The apparatus of claim 1 wherein the third offset voltage is derived using analog or digital techniques.

8. The apparatus of claim 1 wherein the first summation element output comprises a voltage or a current.

9. The apparatus of claim 1 wherein the second summation element output comprises a voltage or a current.

10. The apparatus of claim 1 wherein the third summation element output comprises a voltage or a current.

11. The apparatus of claim 1 wherein one or more of the first summation element, the second summation element, the third summation element, the first switch, the second switch, the third switch, and/or the differential amplifier are implemented using analog techniques or software techniques.

12. The apparatus of claim 1 wherein the apparatus is mounted in a probe.

13. A system capable of making optimal differential and single-ended measurement interfaces, comprising:

a first summation element operable to receive a first input to be measured and a first final offset voltage input, wherein a first summation element output is the algebraic sum of the first input and the first final offset voltage input;

a second summation element operable to receive a second input to be measured and a second final offset voltage input, wherein a second summation element output is the algebraic sum of the second input and the second final offset voltage input;

a first switch operable to receive a first offset voltage and to enable and disable the first final offset voltage;

a second switch operable to receive a second offset voltage and to enable and disable the second final offset;

a differential amplifier operable to receive first and second summation element outputs as differential inputs, having a differential amplifier output which is determined by the difference between the differential inputs;

a third summation element operable to receive the differential amplifier output signal and a third final offset voltage as inputs, and produce a third summation element output which is the algebraic sum of the differential amplifier output signal and the third final offset voltage;

a third switch operable to receive an offset voltage and to enable and disable a third final offset voltage; and control of the first switch, the second switch, the third switch, the first offset, the second offset, or the third offset which is applied from a source or sources external to the apparatus.

14. The apparatus of claim 13 wherein said control is generated by sources within the probe.

15. The apparatus of claim 13 wherein said control is generated by sources external to the probe.

* * * * *